(12) United States Patent
Jennings et al.

(10) Patent No.: US 11,271,581 B1
(45) Date of Patent: Mar. 8, 2022

(54) TIME-MULTIPLEXED DISTRIBUTION OF ANALOG SIGNALS

(71) Applicant: Xilinx, Inc., San Jose, CA (US)

(72) Inventors: John K. Jennings, Dublin (IE); John O'Dwyer, County Kildare (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/876,174

(22) Filed: May 18, 2020

(51) Int. Cl.
*H03M 1/00* (2006.01)
*H03M 1/46* (2006.01)
*H03M 1/36* (2006.01)
*H03M 1/66* (2006.01)
*H02M 3/157* (2006.01)

(52) U.S. Cl.
CPC ............. *H03M 1/46* (2013.01); *H02M 3/157* (2013.01); *H03M 1/002* (2013.01); *H03M 1/365* (2013.01); *H03M 1/662* (2013.01)

(58) Field of Classification Search
CPC ........ H03M 1/46; H03M 1/002; H03M 1/365; H03M 1/662; H03M 1/1205; H03M 1/68; H03M 1/0646; H03M 5/145; H02M 3/157
USPC .......................... 341/141, 142, 155, 161, 162
See application file for complete search history.

(56) References Cited

U.S. PATENT DOCUMENTS

| | | | |
|---|---|---|---|
| 6,956,512 B1 | 10/2005 | San et al. | |
| 7,138,820 B2 | 11/2006 | Goetting et al. | |
| 7,235,999 B2 | 6/2007 | Goetting et al. | |
| 7,650,248 B1 | 1/2010 | Baxter | |
| 8,182,141 B1 | 5/2012 | Collins et al. | |
| 8,207,882 B1 | 6/2012 | Jennings | |
| 8,638,084 B1 | 1/2014 | Abugharbieh et al. | |
| 9,030,341 B2* | 5/2015 | Tan | H03M 1/1052 341/120 |
| 9,377,795 B1 | 6/2016 | Cical et al. | |
| 9,432,035 B2* | 8/2016 | Vyas | H03M 1/1245 |
| 9,716,511 B1* | 7/2017 | Yorita | H03L 7/08 |
| 10,054,968 B2 | 8/2018 | Kamath et al. | |
| 10,228,294 B2 | 3/2019 | Bach et al. | |
| 10,598,729 B1 | 3/2020 | Jennings | |
| 10,790,845 B1* | 9/2020 | Zanchi | H03M 1/0836 |
| 2003/0169192 A1 | 9/2003 | Jonsson | |
| 2007/0030192 A1* | 2/2007 | Son | H03M 1/682 341/156 |
| 2008/0231489 A1* | 9/2008 | Moore | H03M 1/1245 341/155 |

(Continued)

OTHER PUBLICATIONS

Farley et al., "Root Monitoring On an FPGA Using Satellite ADCS," U.S. Appl. No. 16/506,064, filed Jul. 9, 2019.

(Continued)

*Primary Examiner* — Linh V Nguyen
(74) *Attorney, Agent, or Firm* — Paradice and Li LLP

(57) ABSTRACT

Method and apparatus for sharing an analog signal for use by a plurality of devices are disclosed. In some implementations, the analog signal may be generated by a controller. The controller also may generate a control signal to determine when other devices use the analog signal. In one implementation, the control signal may be a token that may be transmitted and received by the other devices. If a device possess the token, then the device may use the analog signal. If the device does not possess the token, then the device may not use the analog signal. In another implementation, the controller may transmit a peer-to-peer message to a selected device. When the selected device receives the peer-to-peer message, then the selected device may use the analog signal. In this manner, the controller ensures that only one device at a time may use the analog signal.

20 Claims, 11 Drawing Sheets

(56) References Cited

U.S. PATENT DOCUMENTS

| | | | |
|---|---|---|---|
| 2009/0073019 A1* | 3/2009 | Ooi | G03G 15/2039 |
| | | | 341/158 |
| 2013/0022136 A1* | 1/2013 | Collins | H03K 19/17744 |
| | | | 375/259 |
| 2013/0307712 A1* | 11/2013 | Ali | H03M 1/1057 |
| | | | 341/120 |
| 2014/0068298 A1 | 3/2014 | Simeral | |
| 2014/0107857 A1 | 4/2014 | Yang et al. | |
| 2016/0079994 A1* | 3/2016 | Lee | H03M 1/181 |
| | | | 341/118 |
| 2017/0272073 A1 | 9/2017 | Betz et al. | |
| 2017/0328790 A1 | 11/2017 | Bach et al. | |
| 2018/0063457 A1* | 3/2018 | Shimamura | H04N 5/3698 |
| 2018/0097825 A1 | 4/2018 | Pavlas et al. | |
| 2019/0028112 A1* | 1/2019 | Kadri | H03M 1/123 |
| 2019/0041471 A1 | 2/2019 | Lazarov et al. | |

OTHER PUBLICATIONS

Jennings, "Device Monitoring Using Satellite ADCS Having Local Capacitors," U.S. Appl. No. 16/535,713, filed Aug. 8, 2019.

Jennings, "Device Monitoring Using Satellite ADCS Having Local Voltage Reference," U.S. Appl. No. 16/509,399, filed Mar. 4, 2020.

Payne, "Monitoring Process, Voltage and Temperature in SoCs, Webinar Recap," SemiWiki.com—The Open Forum for Semiconductor Professionals, Published Apr. 26, 2018, retrieved Nov. 7, 2018, 3 total pages.

Voogel, "Lifetime Reliability Monitoring for Integrated Circuits," U.S. Appl. No. 16/676,025, filed Nov. 6, 2019.

* cited by examiner

TIME-MULTIPLEXED DISTRIBUTION OF ANALOG SIGNALS

TECHNICAL FIELD

This disclosure relates generally to analog signals, and more specifically to a time-multiplexed distribution of analog signals.

BACKGROUND

Many integrated circuit devices may be configured to perform any number of processing or computing tasks. Some integrated circuit devices may be referred to as a system-on-a-chip (SoC) and include complex programmable devices such as field programmable gate arrays (FPGAs) and adaptive compute acceleration platforms (ACAPs).

In many cases, an SoC may include a number of circuits that use one or more analog signals. For example, an SoC may include a number of analog-to-digital converters (ADCs) that use one or more analog reference voltages during a conversion process. Providing multiple analog references voltages for these ADCs may consume SoC area and increase power consumption.

Therefore, there is a need for an area efficient analog signal generation and distribution system for use in an integrated circuit devices.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter. Moreover, the systems, methods and devices of this disclosure each have several innovative aspects, no single one of which is solely responsible for the desirable attributes disclosed herein.

One innovative aspect of the subject matter described in this disclosure can be implemented as an analog signal distribution system. The system includes an analog signal controller configured to generate an analog signal and transmit control signals that restrict use of the analog signal to one device. In some implementations, the control signals may include a token that permits a device possessing the token to use the analog signal. The analog signal distribution system may further include a first device configured to receive the token, use the analog signal as a reference signal, and transmit the token to a second device.

Another innovative aspect of the subject matter described in this disclosure can be implemented in a device. The device includes a plurality of hardware blocks including programmable logic cells and memory cells, an analog signal controller configured to generate an analog signal, and transmit control signals that restrict the use of the analog signal to one of a plurality of devices, and a first device configured to receive the analog signal and use the analog signal as a reference signal based on the control signal.

Another innovative aspect of the subject matter described in this disclosure can be implemented as a method. The method may include receiving a token through a control bus, using an analog signal in response to the received token, and transmitting the token through the control bus.

BRIEF DESCRIPTION OF THE DRAWINGS

The example implementations are illustrated by way of example and are not intended to be limited by the figures of the accompanying drawings. Like numbers reference like elements throughout the drawings and specification. Note that the relative dimensions of the following figures may not be drawn to scale.

DETAILED DESCRIPTION

Figure 1:
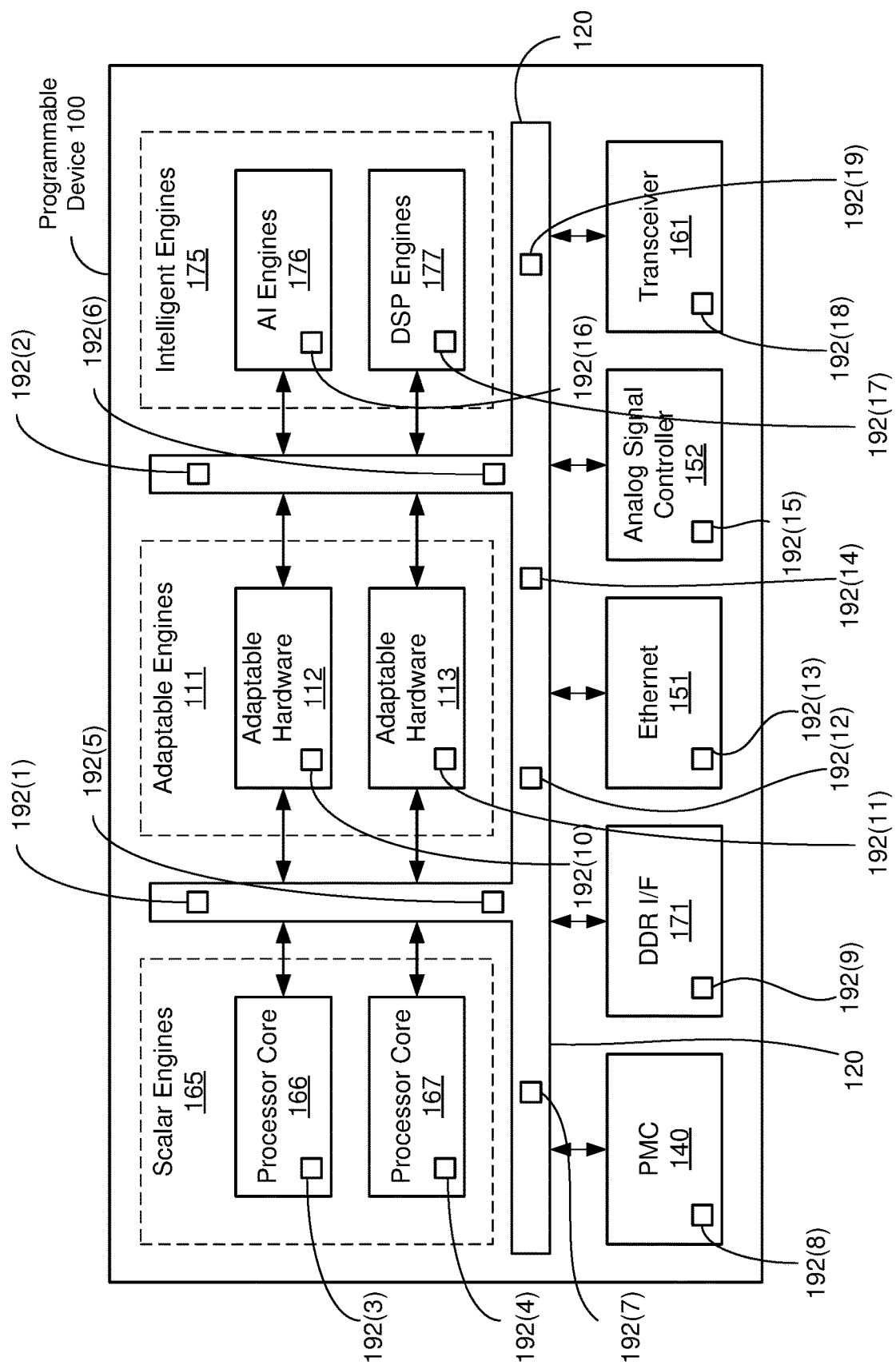
FIG. 1 shows a block diagram of an example programmable device within which various aspects of the present disclosure may be implemented.

Implementations of the subject matter described in this disclosure may be used to control access to an analog signal, such as an analog reference signal that may be distributed through a device. In some implementations, an analog signal controller may generate and distribute the analog signal and generate control signals that enable other devices to access (e.g., use) the analog signal. In some implementations, the control signals may limit access to the analog signal to one device at a time. In some other implementations, the control signals may include a token that may be passed between devices. A device may use the analog signal after receiving (e.g., when possessing) the token and may not use the analog signal when not possessing the token. After the device has completed using the analog signal, the device may pass the token to another device. Other control signals are contemplated including timing signals and peer-to-peer communications to control access to the analog signal.

Particular implementations of the subject matter described in this disclosure can be implemented to realize one or more of the following potential advantages. By controlling access to a distributed analog signal, multiple devices may share the use of the analog signal without causing interference or distortion. In this manner, area associated with the analog signal generation may be shared by multiple devices reducing total area requirements and thereby reducing costs.

In the following description, numerous specific details are set forth such as examples of specific components, circuits, and processes to provide a thorough understanding of the present disclosure. The term "coupled" as used herein means coupled directly to or coupled through one or more intervening components or circuits. In some aspects, the term "vicinity" as used herein may refer to a distance over which analog signals indicative of operating conditions can be transmitted via relatively short local signal wires with minimal signal degradation. Also, in the following description and for purposes of explanation, specific nomenclature and/or details are set forth to provide a thorough understanding of the example implementations. However, it will be apparent to one skilled in the art that these specific details may not be required to practice the example implementations. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all implementations defined by the appended claims.

FIG. 1 shows a block diagram of an example programmable device 100 within which various aspects of the present disclosure may be implemented. Note that FIG. 1 is intended to illustrate only one possible example of a programmable device. In other implementations, a programmable device may include different numbers of logic blocks arranged in rows and/or columns, as well as other types of blocks including input/output blocks, memory controller blocks, transceiver blocks, and the like. Further, in some aspects, the programmable device 100 may implement the functionality associated with a system on a chip (SoC).

The programmable device 100 may include a network-on-chip (NoC) interconnect system 120, a platform management controller (PMC) 140, scalar engines 165, adaptable engines 111, intelligent engines 175, a double data rate (DDR) memory interface 171, an ethernet block 151, an analog signal controller 152, a transceiver block 161, and satellite monitors 192(1)-192(19).

The NoC interconnect system 120, which may be fabricated as part of the programmable device 100, may include any number of segments connected together to implement a high-speed, high-bandwidth programmable signal routing network that can selectively interconnect various device resources (such as the scalar engines 165, the adaptable engines 111, the intelligent engines 175, the PMC 140, the DDR memory interface 171, the ethernet block 151, the analog signal controller 152, the transceiver block 161, and the satellite monitors 192(1)-192(19)) with each other and with other components not shown for simplicity. For illustration purposes only, the NoC interconnect system 120 is shown to include a horizontal segment and two vertical segments. The actual implementation of the NoC interconnect system 120 may include any number of segments arranged in any feasible manner. The segments may allow the NoC interconnect system 120 to exchange signals and data directly between any connected blocks, engines, resources, etc., without any intervening circuits or interfaces.

The NoC interconnect system 120 may be configured to transmit information between various device resources as data packets that can be individually addressed and routed from a source location to a destination location. In some aspects, the data packets transmitted on the NoC interconnect system 120 may be dynamically addressable.

The PMC 140 may include a local controller (sometimes referred to as a root controller or root monitor, not shown for simplicity) to control operations of the programmable device 100. Thus, the PMC 140 may include a configuration interface to receive a configuration bitstream and accordingly configure controlling registers within the programmable device 100. The local controller may also control operations of the analog signal controller 152 and the satellite monitors 192(1)-192(19).

The DDR memory interface 171 may be coupled to DDR memory (not shown for simplicity) to enable storage and retrieval of data for the programmable device 100. In some implementations, the DDR memory interface 171 may include DDR memory bus transceivers and a DDR memory controller (both not shown for simplicity) to interface with and control DDR memory circuits. The ethernet block 151 may include physical ethernet transceivers and an ethernet control module (not shown for simplicity) to enable data to be transmitted and received using one or more ethernet protocols.

The transceiver block 161 may provide signal connections with one or more other devices or chips (not shown for simplicity) connected to the programmable device 100. In some implementations, the transceiver block 161 may be implemented as a number of repeatable tiles positioned in various locations along the sides of the programmable device 100. In other implementations, the transceiver blocks 161 may be positioned in other suitable locations of the programmable device 100. Further, the transceiver block 161 may include any number of suitable I/O circuits or devices including extremely high-performance I/O (XPIO) circuits, high-density I/O (HDIO) circuits, and multiplexed I/O (MIO) circuits.

The scalar engines 165 may include processor cores 166 and 167. Although two processor cores 166 and 167 are shown, the scalar engines 165 may include any feasible number of processor cores. In some embodiments, the processor cores 166 and 167 may include Advanced RISC Machine (ARM) cores, however other processor cores are possible. The processor cores 166 and 167 may be configured to perform any number of processing tasks including numeric and/or procedural processing tasks.

The adaptable engines 111 may include adaptable hardware blocks 112 and 113. Although two adaptable hardware blocks 112 and 113 are shown, the adaptable engines 111 may include any feasible number of adaptable hardware blocks. In some embodiments, the adaptable hardware blocks 112 and 113 may include any feasible number programmable logic cells and memory cells. The programmable cells and memory cells may be configured to implement conventional FPGA designs as well as to form customized memory hierarchies for use within the programmable device 100.

The intelligent engines 175 may include an artificial intelligence (AI) engine block 176 and a digital signal processing (DSP) engine block 177. In other embodiments, the intelligent engines 175 may include any number of AI engine blocks 176 and any number of DSP engine blocks 177. The AI engine block 176 may include any feasible number of AI inference engines that may be configured to perform any number of machine learning tasks. The DSP engine block 177 may include any feasible number of DSP processing cores that may be configured to perform any number of DSP tasks.

Each of the plurality of satellite monitors 192(1)-192(19) may include one or more sensors, including various environmental sensors. As shown, the plurality of satellite monitors 192(1)-192(19) may be distributed throughout various regions of the programmable device 100. In some implementations, one or more of the plurality of satellite monitors 192(1)-192(19) may be disposed within the scalar engines 165, the adaptable engines 111 and the intelligent engines 175 as well as within the NoC interconnect system 120 and various other blocks. The satellite monitors 192(1)-192(19) may include various circuits and devices to capture environmental information associated with regions near each satellite monitor. For example, the satellite monitors 192(1)-192(19) may include an analog-to-digital converter (ADC) to measure output signals from temperature sensors, voltage dividers, or other environmental sensors.

The analog signal controller 152 may provide one or more analog signals for use by any feasible circuit or device within the programmable device 100. For example, the analog signal controller 152 may provide a reference voltage that may be shared or time-multiplexed for the ADCs within the satellite monitors 192(1)-192(19). In some implementations, the analog signal controller 152 may provide the analog signals through an analog channel and may control access to the analog channel through a control bus (analog channel and control bus not shown for simplicity). The analog signal controller 152 is described in more detail below with respect to FIG. 3.

Figure 2:
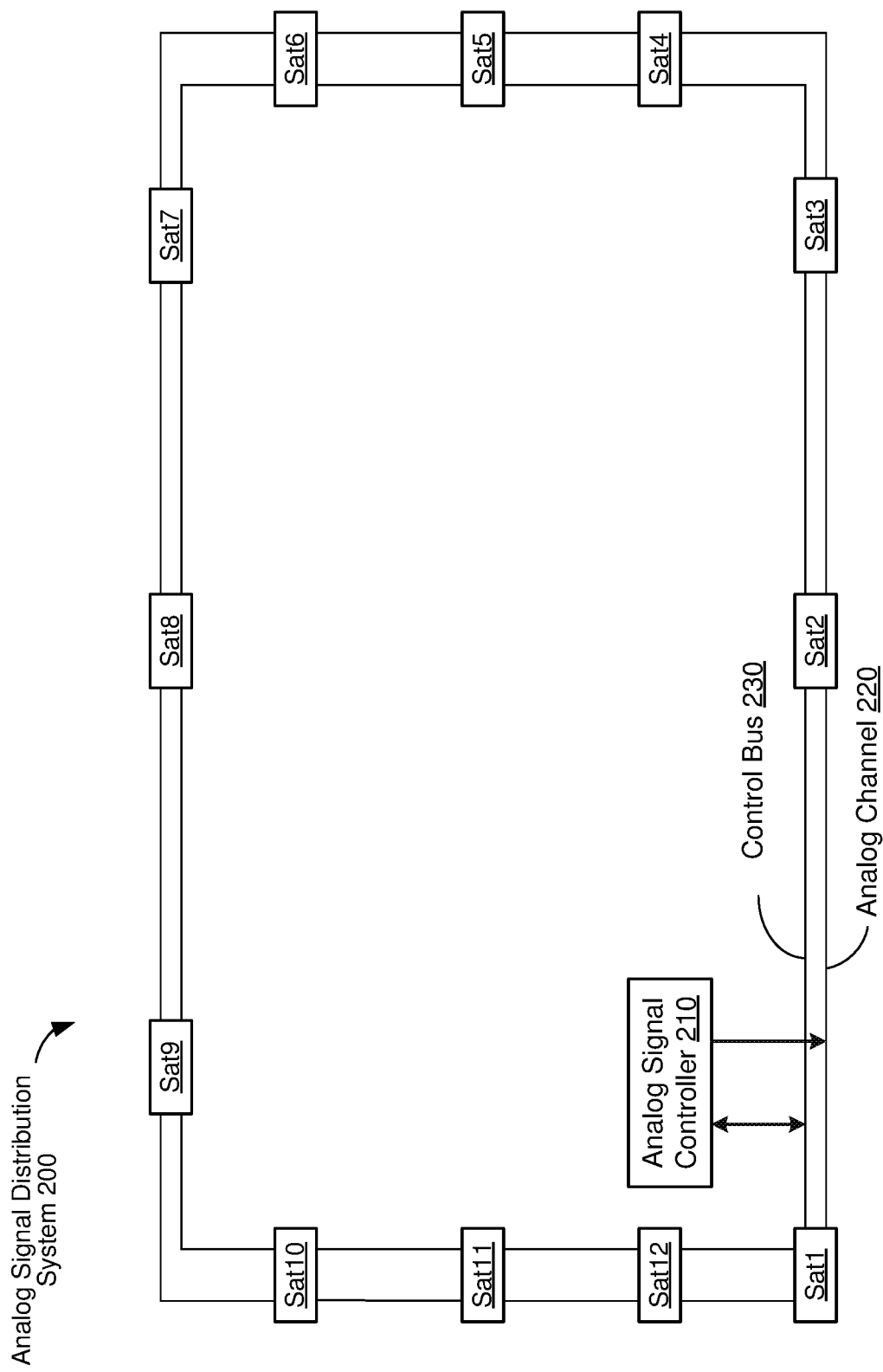
FIG. 2 shows a functional block diagram of an analog signal distribution system, in accordance with some implementations.

FIG. 2 shows a functional block diagram of an analog signal distribution system 200, in accordance with some implementations. The analog signal distribution system 200, which may be implemented in the programmable device 100 of FIG. 1, may include analog signal controller 210, an analog channel 220, and a control bus 230. FIG. 2 also shows a plurality of satellite monitors SAT1-SAT12 that may be implementations of any of the satellite monitors 192(1)-192(19) of FIG. 1. The satellite monitors SAT1-SAT12 illustrate example devices that use one or more analog signals provided by the analog signal controller 210. In other implementations, the programmable device 100 may include other feasible devices or circuits that use analog signals, including voltage regulators, voltage and/or current sources, or the like. The analog signal controller 210, which may be an implementation of the analog signal controller 152 of FIG. 1, may be coupled to the satellite monitors SAT1-SAT12 via the analog channel 220 and the control bus 230.

The analog signal controller 210 may generate one or more analog signals. In some implementations, the analog signal controller 210 may include one or more controllable voltage regulators to generate stable, programmable, and accurate analog signals. In some aspects, one or more of the generated analog signals may be a voltage suitable for use as a reference voltage.

The analog signals from the analog signal controller 210 may be coupled to and distributed by the analog channel 220. The analog channel 220 may be used to distribute the analog signals to any feasible region or device within the programmable device 100. In some implementations, the analog channel 220 may include any feasible number of conductors, traces, buffers and the like to accurately distribute the analog signal.

The analog signal controller 210 may control access to the analog signals in the analog channel 220 through the control bus 230. In some embodiments, when a device uses (samples, for example) an analog signal, the analog signal may temporarily dip, spike or otherwise distort. By controlling access to the analog signals, several devices may share the analog signal without experiencing interference and/or distortion. In some aspects, "controlling access" may refer to controlling when a device uses or samples the analog signal, and not necessary refer to when a device has physical access to the analog channel 220. In some implementations, the analog signal controller 210 may use the control bus 230 to implement a number of different protocols to control access to the analog channel 220.

For example, access and use of the analog channel 220 may be controlled through an implementation of a token-ring protocol. In some implementations, the analog signal controller 210 may generate a token that is passed between analog signal consumers (in this example, the satellite monitors SAT1-SAT12). If an analog signal consumer possesses the token, then that device may use the analog signal in the analog channel 220. If a device does not possess the token, then that device cannot use the analog signal. When the analog signal consumer has finished using the analog signal, then the token is passed to another device. In this manner, the use of the analog signal may be shared (multiplexed) with any feasible number of devices. This token-ring protocol limits the use of the analog signal to one analog signal consumer at a time, thereby eliminating interference from other devices and reducing distortion.

The token may provide coarse time boundary when the analog signal consumer may use the analog signal. In some aspects, however, the analog signal consumer itself may control more precisely when the analog signal is used. For example, the analog signal consumer may receive the token and wait for a time period to pass to allow the analog signal to settle. In addition, the analog signal consumer may determine the duration of the analog signal access. For example, when use of the analog signal is complete, analog signal consumer places or returns the token to the control bus for used by another analog signal consumer. This access protocol is described in more detail below with respect to FIG. 5.

In some other implementations, the analog signal controller 210 may communicate directly with each analog signal consumer to grant access to the analog channel 220. In this way, the analog signal controller 210 may determine which analog signal consumers may access the analog channel 220 as well as control access times and/or durations. For example, the analog signal controller 210 may implement a peer-to-peer communications protocol to direct selected analog signal consumers to access the analog signal. This access protocol is described in more detail below with respect to FIG. 6.

In still other implementations, the analog signal controller 210 may control the use of analog signals through a timing signal. For example, the analog signal controller 210 may generate a timing signal for analog signal consumers to monitor and determine when to access the analog channel 220. This procedure is described in more detail below with respect to FIG. 7.

In some implementations, the analog signal controller 210 may include two or more analog signal generators that may contemporaneously generate two or more independent analog signals, where each independent analog signal coupled to a distinct conductor in the analog channel 220. Therefore, in some cases, the analog signal controller 210 may control access to two or more independent analog signals.

As shown, the analog channel 220 and the control bus 230 may be arranged to form a logical loop to connect the analog signal consumers (e.g., satellite monitors SAT1-SAT12) and the analog signal controller 210. This "loop" topology may lend itself to a token-ring protocol where a token is passed from one analog signal consumer to another. For example, analog channel 220 and the control bus 230 (e.g., the logical loop) may enable a token generated by the analog signal controller 210 to be passed to the satellite monitor SAT1. The satellite monitor SAT1 may then pass the token to the satellite monitor SAT2. In some implementations, the arrangement of the analog channel 220 and the control bus 230 may determine the order that the token is passed from satellite monitor to satellite monitor. In other implementations, the analog channel 220 and the control bus 230 may form a star topology or any other feasible topology to connect the analog signal consumers to the analog signal controller 210.

Figure 3:
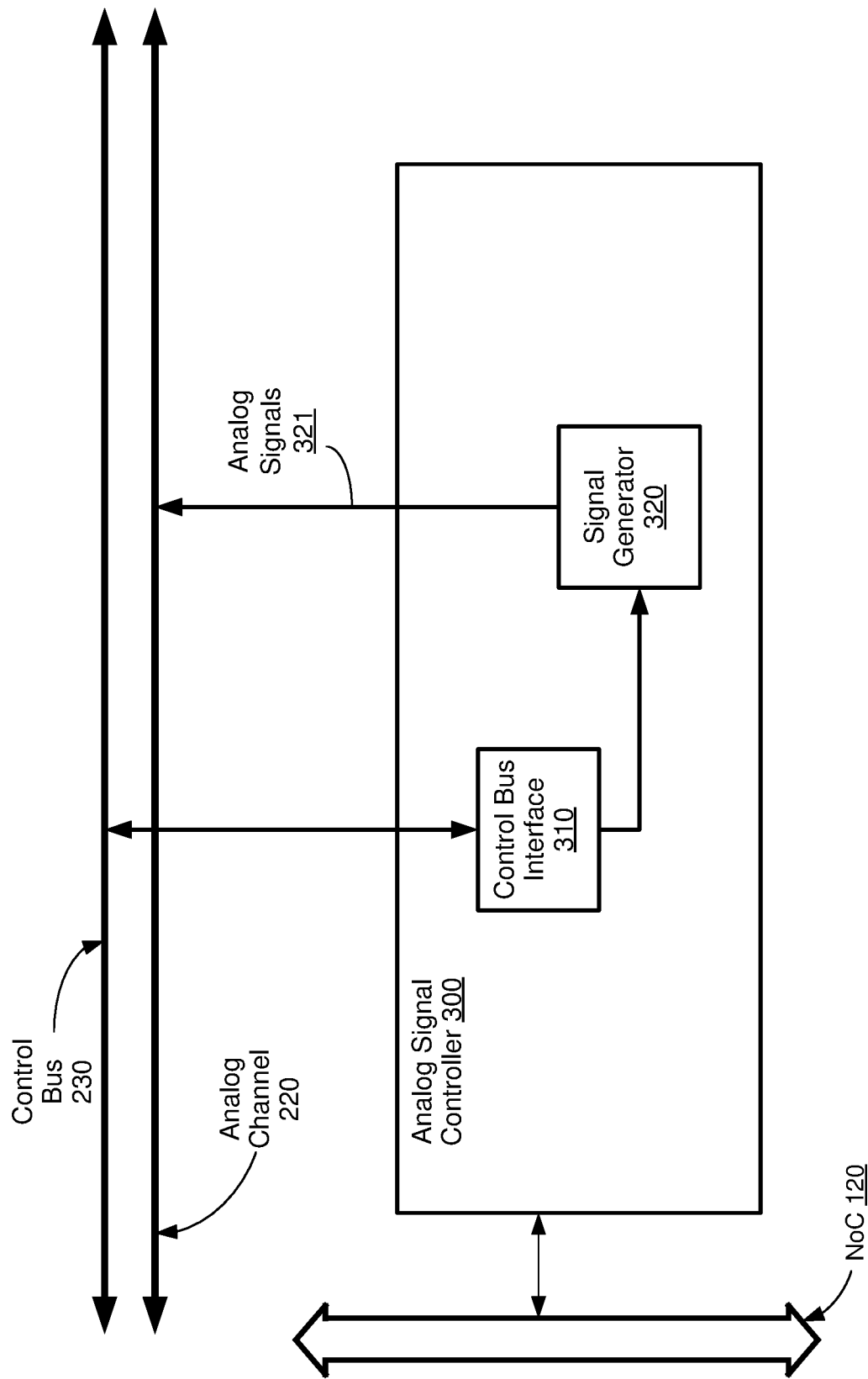
FIG. 3 shows a block diagram of an example analog signal controller, in accordance with some implementations.

FIG. 3 shows a block diagram of an example analog signal controller 300, in accordance with some implementations. The analog signal controller 300, which may be an implementation of the analog signal controller 210 of FIG. 2, includes a control bus interface 310 and a signal generator 320. In addition, the analog signal controller 300 may be coupled to the NoC interconnect system 120 of FIG. 1, and the analog channel 220, and the control bus 230 of FIG. 2. In some implementations, the analog signal controller 300 may generate one or more analog signals 321 and control use of the analog signals 321 through the control bus interface 310 and the control bus 230. In some implementations, the analog signal controller 300 may be controlled by a local controller, a root controller, the PMC 140 (not shown for simplicity) or the like through the NoC interconnect system 120.

The signal generator 320 may be coupled to the analog channel 220. In some implementations, the signal generator 320 may include one or more controllable analog signal generators such as variable voltage and/or current sources to generate one or more analog signals 321 that are distributed through the analog channel 220. The controllable analog signal generators may be implemented with any feasible devices, circuits, or technology. For example, the controllable analog signal generators may include linear or switching regulators configured to provide any feasible voltage or current. In some cases, the analog signal generators may provide an analog signal 321 that may be used as a reference voltage or a reference current.

The control bus interface 310 may be coupled to the control bus 230 to control when analog signal consumers may use the analog signals 321. In some implementations, the control bus interface 310 may implement a token-ring protocol by passing a token through the control bus 230 to control the use of the analog signals 321. In some other implementations, the control bus interface 310 may implement a peer-to-peer communication protocol between the analog signal controller 300 and one or more analog signal consumers to control the use of the analog signals 321. In still other implementations, the control bus interface 310 may provide a timing signal for analog signal consumers to receive and determine when to access the analog signals 321.

Figure 4:
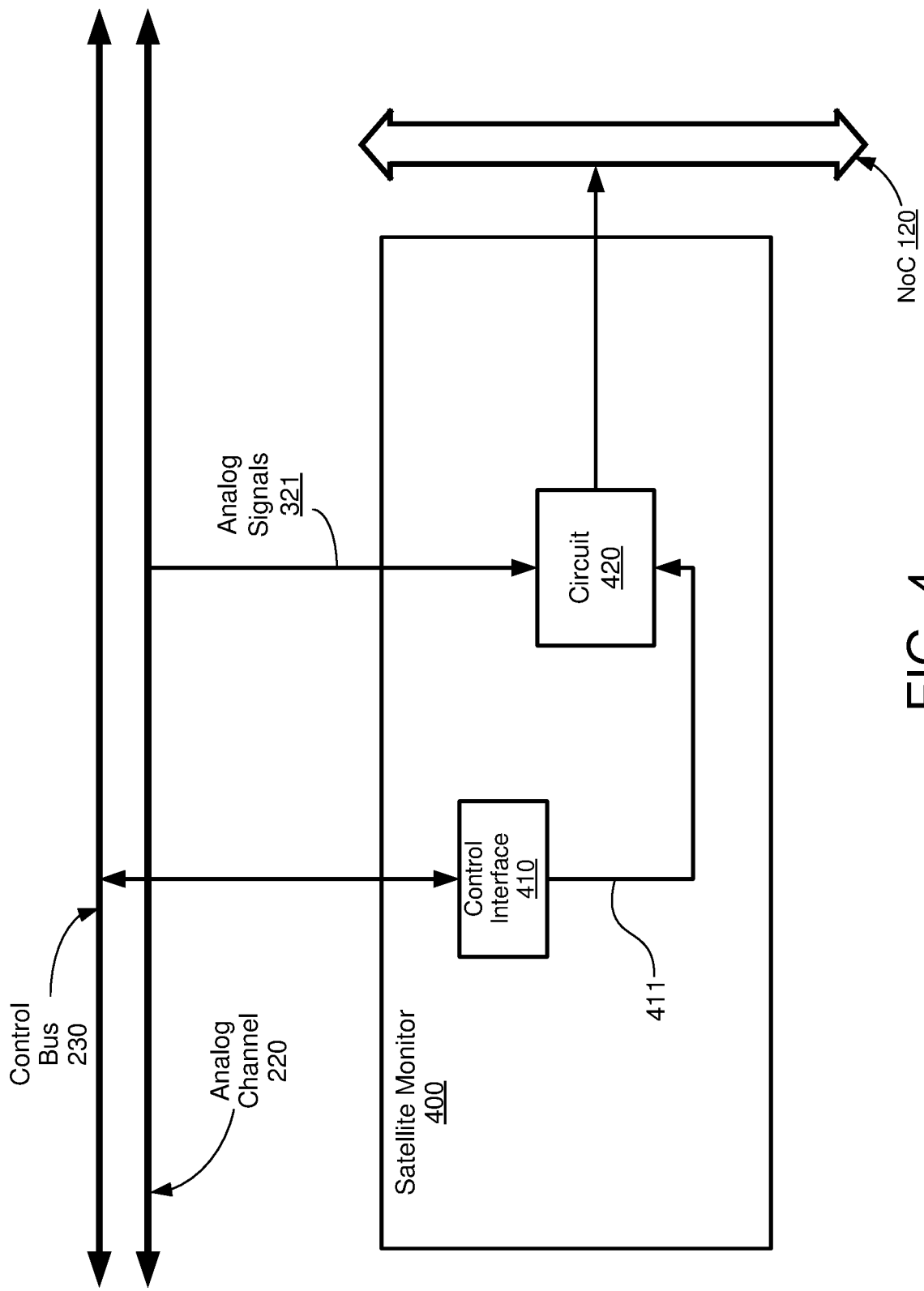
FIG. 4 shows a block diagram of an example satellite monitor, in accordance with some implementations.

FIG. 4 shows a block diagram of an example satellite monitor 400, in accordance with some implementations. The satellite monitor 400 may be an implementation of the satellite monitors 192(1)-192(19) of FIG. 1 and the satellite monitors SAT1-SAT12 of FIG. 2. The satellite monitor 400 may illustrate how an analog signal consumer may be configured to operate with, and otherwise use, the analog signals 321 provided by the analog signal controller 300 of FIG. 3. The satellite monitor 400 may include a control interface 410 and a circuit 420. In addition, the satellite monitor 400 may be coupled to the NoC interconnect system 120 of FIG. 1, and the analog channel 220 and the control bus 230 of FIG. 2.

The control interface 410 may communicate with other devices, such as other satellite monitors and the analog signal controller 300 of FIG. 3, through the control bus 230. The control interface 410 may execute a variety of operations, including but not limited to, a token-ring protocol, a peer-to-peer communication protocol, and a timing signal-based access procedure to control use of the analog signals 321 from the analog channel 220. For example, the control interface 410 may execute a token-ring communication protocol and receive a token from the control bus 230 indicating that the satellite monitor 400 may access one or more analog signals 321 from the analog channel 220. In another example, the control interface 410 may execute a peer-to-peer communication protocol and communicate with the analog signal controller 300 to determine when the satellite monitor 400 may access the one or more analog signals 321. In still another example, the control interface 410 may receive a timing signal from the control bus 230 and access the one or more analog signals 321 based on the timing signal.

The control interface 410 also may control operations of the circuit 420. In some implementations, the control interface 410 may control an ADC (not shown for simplicity) through a control signal 411. For example, the control bus 230 may direct the circuit 420 (through the control interface 410) to use an analog signal 321 from the analog channel 220. In some implementations, the analog signal 321 may be a local analog reference signal for use within the satellite monitor. In this manner, the local analog reference signal may be generated separately and/or remotely from the satellite monitor 400. Thus, the area associated with generating the local analog reference signal is shared with other analog signal consumers, reducing the overall area of the programmable device 100. In some cases, the circuit 420 may provide data (such as digital conversion data) to the NoC interconnect system 120.

Figure 5:
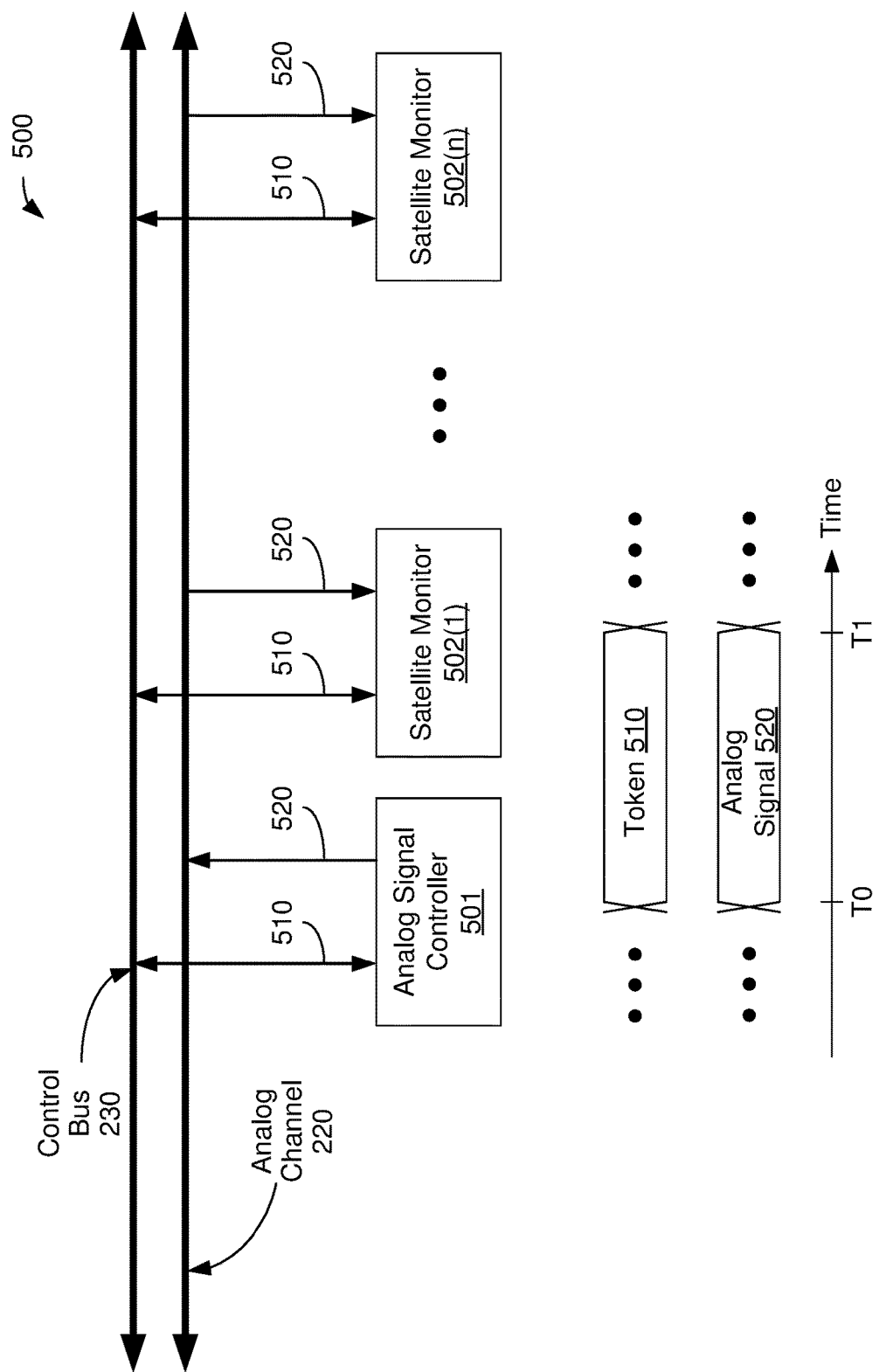
FIG. 5 shows a simplified diagram of an analog signal distribution system, in accordance with some implementations.

FIG. 5 shows a simplified diagram of an analog signal distribution system 500, in accordance with some implementations. The analog signal distribution system 500 may be an implementation of the analog signal distribution system 200 of FIG. 2. The analog signal distribution system 500 may include an analog signal controller 501 and satellite monitors 502(1)-502(n). The analog signal controller 501 may be an implementation of the analog signal controller 300 of FIG. 3 and the satellite monitors 502(1)-502(n) may be implementations of the satellite monitor 400 of FIG. 4. Although n satellite monitors are shown, in other implementations, the analog signal distribution system 500 may include any feasible number of satellite monitors. Further, the satellite monitors 502(1)-502(n) illustrate example analog signal consumers for ease of explanation. Other devices that perform the functions of analog signal consumers are possible, including distributed voltage regulators, voltage and/or current sources, or the like. The analog signal controller 501 and the satellite monitors 502(1)-502(n) may be coupled to the analog channel 220 and the control bus 230 of FIG. 2.

The analog signal distribution system 500 uses a token-ring protocol to manage the use of one or more analog signals 520 provided by the analog signal controller 501. The analog signals 520 may be an implementation of the analog signal 321 of FIG. 3. The analog signal controller 501 may output control signals in the form of a token 510 onto the control bus 230. In some implementations, the token 510 may be any arrangement of bits, bytes, words, etc., that is associated with the analog signal 520. In some aspects, a different token 510 may be associated with different analog signals 520. For example, a first analog signal 520 having a first voltage may be associated with a first token 510, and a second analog signal (not shown for simplicity) having a second voltage may be associated with a second token (not shown for simplicity). The satellite monitor 502(1) may receive the token 510 from the control bus 230 and use the analog signal 520 while possessing the token 510. As described with respect to FIG. 2, in some implementations, the satellite monitor 502(1) may receive the token 510 from another satellite monitor (not shown for simplicity) based on the logical loop formed by the analog channel 220 and the control bus 230. Thus, possession of the token 510 prevents any other satellite monitors from using, and possibly disturbing or distorting the analog signal 520. When the satellite monitor 502(1) has finished operations concerning the analog signal 520, the satellite monitor 502(1) outputs (e.g., passes) the token 510 to a second satellite monitor 502(2). This process is repeated until the last satellite monitor 502(n) has completed its use of the analog signal 520. When the use of the analog signal 520 is complete, the satellite monitor 502(n) returns the token 510 to the analog signal controller 501. In this manner, use of the analog signals 520 may be restricted to one satellite monitor 502(1)-502(n) at a time.

As shown, the satellite monitor 502(1) may possess the token 510 from time T0 to time T1. Therefore, the satellite monitor 502(1) may use the analog signal 520 at any time between time T0 and T1. In some implementations, the satellite monitor 502(1) may control settling and hold times associated with the analog signal 520. For example, the satellite monitor 502(1) may wait a first time period after time T0 before using the analog signal 520 (e.g., a settling time) and then wait a second time period before time T1 (e.g., a hold time) before passing the token 510.

In some implementations, the analog signal controller 501 may adjust or change the analog signal 520 after the token 510 has been returned. For example, after the token 510 is received by the analog signal controller 501, the analog signal 520 may be changed to a different voltage, current, frequency, and/or duty cycle. The analog signal controller 501 may then output a different token 510 to the control bus 230 to indicate the availability of a different analog signal (not shown for simplicity). In some implementations, the token 510 may indicate the voltage, current, frequency, and/or duty cycle associated with the analog signal 520. Thus, the satellite monitor 502(1)-502(n) may determine characteristics of the analog signal 520 through the token 510.

Figure 6:
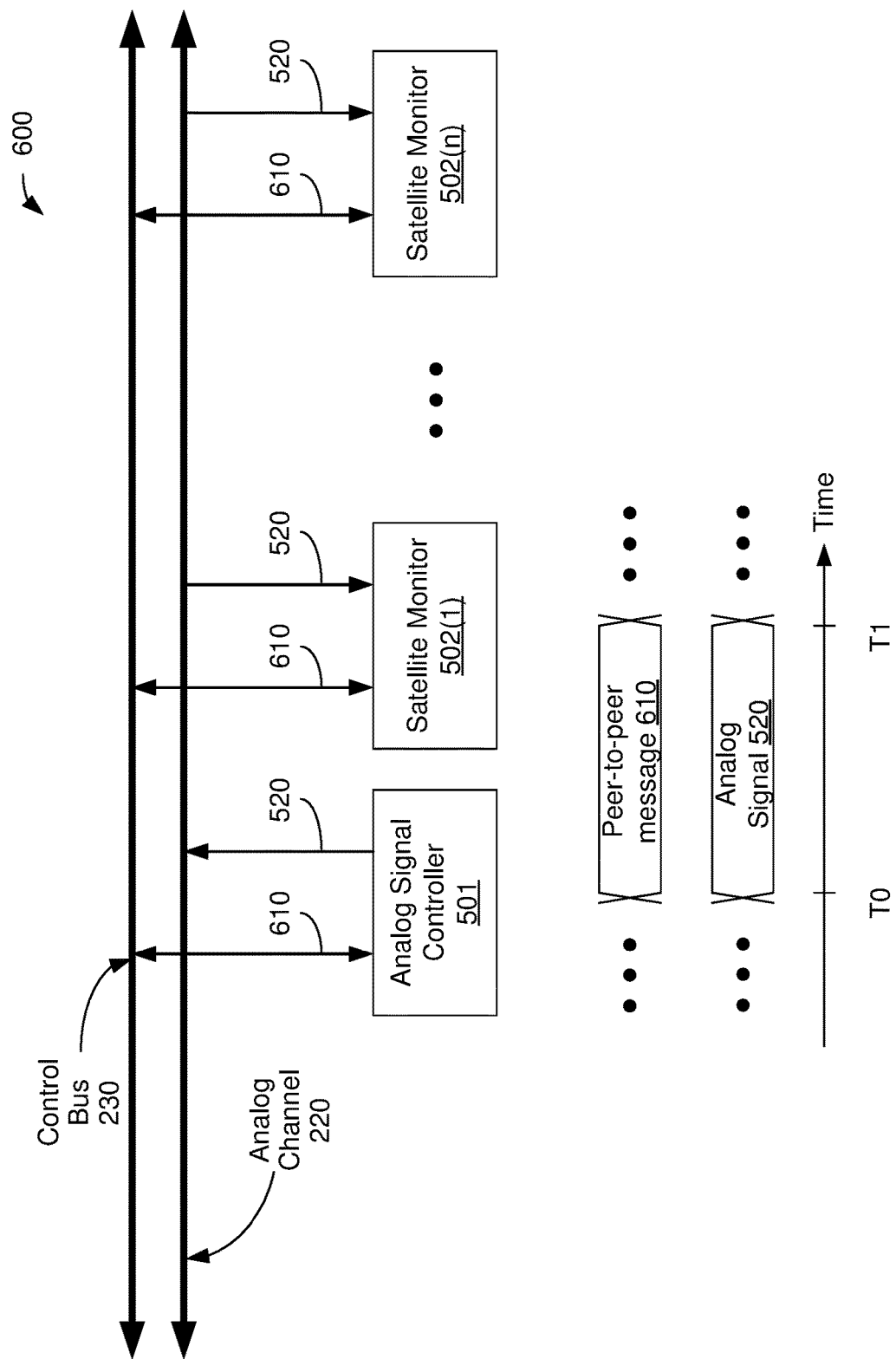
FIG. 6 shows a simplified diagram of another analog signal distribution system, in accordance with some implementations.

FIG. 6 shows a simplified diagram of another analog signal distribution system 600, in accordance with some implementations. The analog signal distribution system 600 may be another implementation of the analog signal distribution system 500 of FIG. 5 and includes the analog signal controller 501 and the satellite monitors 502(1)-502(n).

The analog signal distribution system 600 uses a peer-to-peer communication protocol to manage the use of the analog signals 520 provided by the analog signal controller 501. The analog signal controller 501 may communicate directly with any satellite monitor 502(1)-502(n) through a peer-to-peer message 610 to indicate that the analog signal 520 is ready for use. In some aspects, the peer-to-peer message 610 may instruct the receiving satellite monitor 502(1)-502(n) to use the analog signal 520. In some implementations, the satellite monitor 502(1)-502(n) may transmit an acknowledgement message to the analog signal controller to indicate that the respective satellite monitor is finished using the analog signal 520.

As shown, the analog signal controller 501 may participate in peer-to-peer communications with at least one of the satellite monitors 502(1)-502(n) between times T0 and T1. Furthermore, during the time period between times T0 and T1, the analog signal controller 501 may hold the analog signal 520 stable. In addition, the peer-to-peer message 610 may describe characteristics (voltage, current, frequency, duty cycle, etc.) of the analog signal 520 to the receiving satellite monitor.

The analog signal controller 501 may generate a variety of different analog signals 520. The value or characteristics of the analog signal 520 may be changed prior to each peer-to-peer message 610. In some cases, the analog signal controller 501 may provide, and the satellite monitors 502(1)-502(n) may use two or more different analog signals 520 that may be distributed by two or more conductors of the analog channel 220. Each unique analog signal 520 may be associated with a unique peer-to-peer message 610. Thus, through the peer-to-peer message 610, the satellite monitors 502(1)-502(n) may determine the value or characteristics of the analog signal 520.

Figure 7:
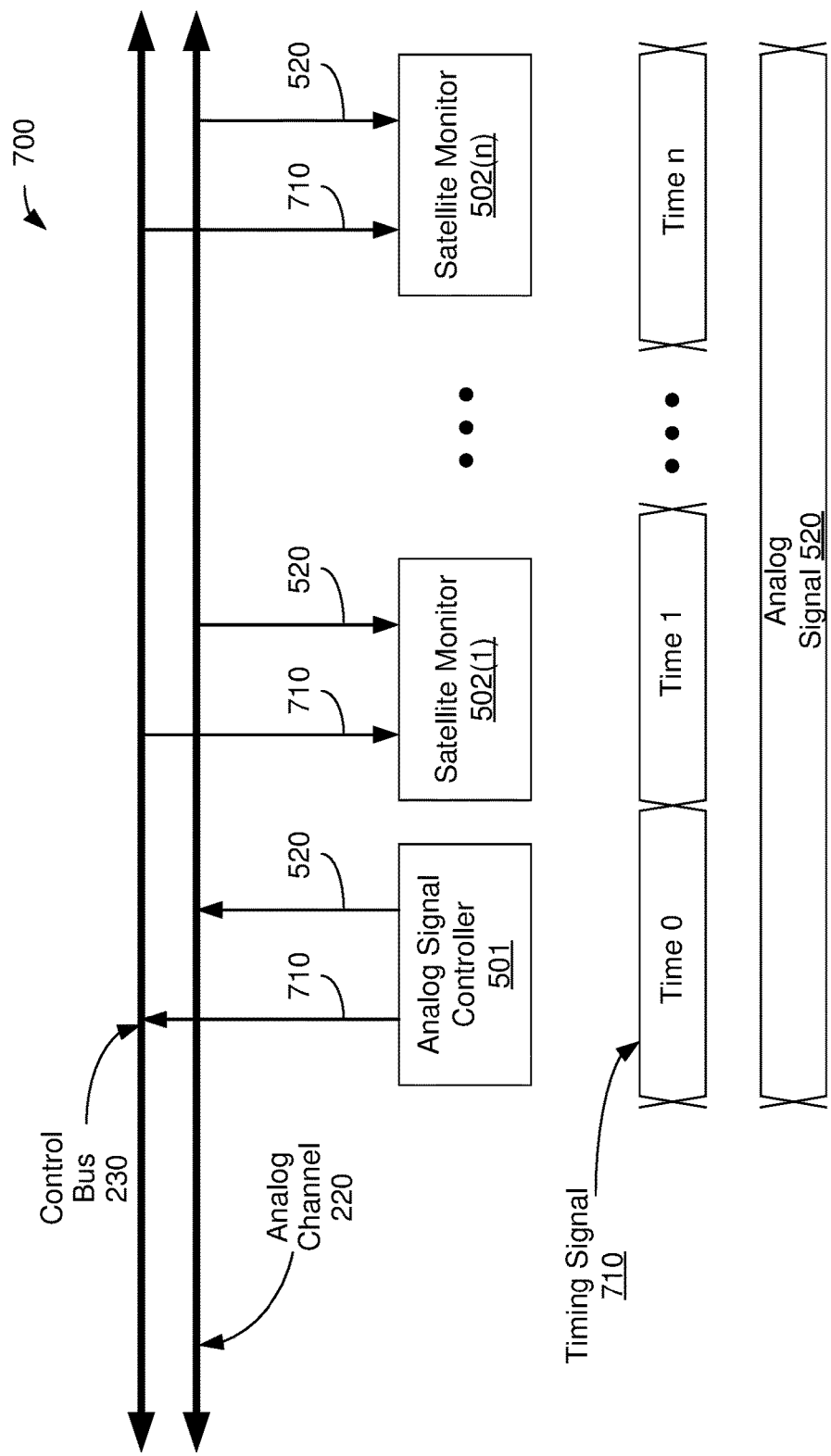
FIG. 7 shows a simplified diagram of yet another analog signal distribution system, in accordance with some implementations.

FIG. 7 shows a simplified diagram of yet another analog signal distribution system 700, in accordance with some implementations. The analog signal distribution system 700 may be another implementation of the analog signal distribution system 500 of FIG. 5 and include the analog signal controller 501, and satellite monitors 502(1)-502(n).

The analog signal distribution system 700 may use a timing signal-based procedure to manage the use of the one or more analog signals 520 provided by the analog signal controller 501. The analog signal controller 501 may provide control signals in the form of a timing signal 710 to the control bus 230 and the one or more analog signals 520 to the analog channel 220.

Access to the analog signal 520 by the satellite monitors 502(1)-502(n) may be based on timing information indicated by the timing signal 710. Particular times (time periods, time slots, time stamps, or the like), may be assigned to particular satellite monitors 502(1)-502(n). For example, "Time 0" may be assigned to satellite monitor 502(1). When the satellite monitor 502(1) detects Time 0 as indicated by the timing signal 710, the satellite monitor 502(1) may access the analog signal 520. In a similar manner, the other satellite monitors 502(2)-502(n) may look for different timing information in the timing signal 710 to access the analog signal 520. In some implementations, the timing signal 710 may repeat periodically. Thus, each satellite monitor 502(1)-502(n) may have periodic access to the analog signal 520.

Figure 8:
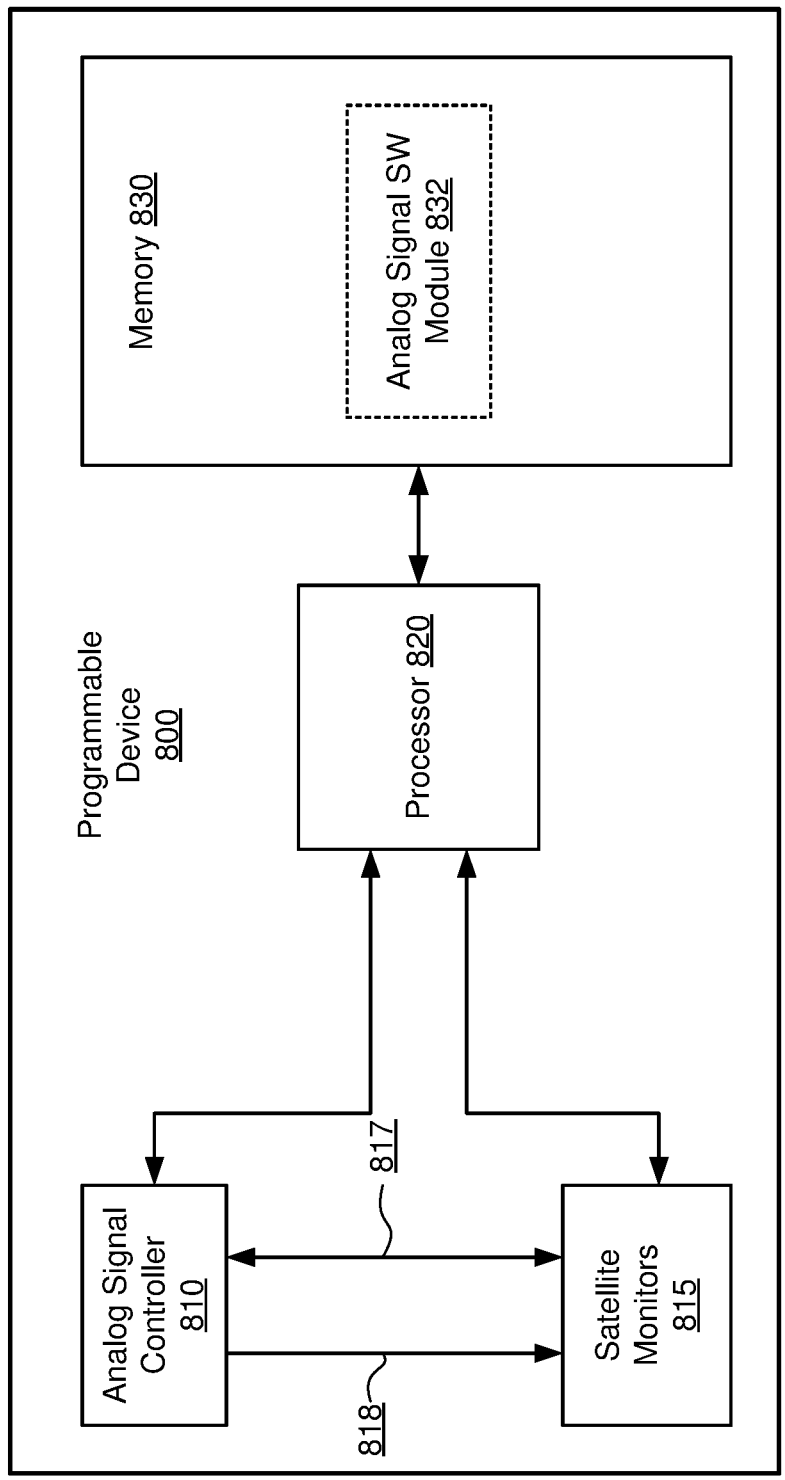
FIG. 8 shows a block diagram of an example programmable device, in accordance with some implementations.

FIG. 8 shows a block diagram of an example programmable device 800, in accordance with some implementations. The programmable device 800, which may be an implementation of the programmable device 100 of FIG. 1, may include an analog signal controller 810, satellite monitors 815, a bus 817, an analog signal 818, a processor 820, and memory 830. The analog signal controller 810 may be an implementation of the analog signal controller 152 of FIG. 1, the analog signal controller 210 of FIG. 2, the analog signal controller 300 of FIG. 3, or the analog signal controller 501 of FIG. 5. The satellite monitors 815 may be an implementation of the satellite monitors 192(1)-192(19) of FIG. 1, the satellite monitors SAT1-SAT12 of FIG. 2, the satellite monitor 400 of FIG. 4, or the satellite monitors 502(1)-502(n) of FIG. 5. As described above, the satellite monitors 815 are example analog signal consumers. Other devices or circuits may use the analog signal 818 in manner similar to the satellite monitors 815. The bus 817 may be an implementation of the control bus 230 of FIG. 2 and the analog signal 818 may be an implementation of the analog signals 321 of FIG. 3. In addition, or in the alternative, the programmable device 800 may include additional components, devices, functional units and the like, not shown here for simplicity.

The analog signal controller 810 may include one or more circuits, components, and/or devices to generate the analog signal 818. The analog signal 818 may be coupled to the satellite monitors 815. The satellite monitors 815 may share the use of the analog signal 818 to perform one or more operations, including using the analog signal 818 as a reference signal for ADC operations. The analog signal controller 810 may control use of the analog signal 818 through the bus 817 which is also coupled to the satellite monitors 815. The analog signal controller 810 and the satellite monitor 815 may be coupled to the processor 820.

The processor 820 may be any suitable one or more processors capable of executing scripts or instructions of one or more software programs stored in the memory 830. In some implementations, the processor 820 may be or include one or more microprocessors providing processor functionality and an external memory providing at least a portion of machine-readable media. In other implementations, the processor 820 may be or include an Application Specific Integrated Circuit (ASIC) with the processor, a bus interface, a user interface, and at least a portion of the machine-readable media integrated into a single chip or device.

The memory 830 may include a non-transitory computer-readable storage medium (e.g., one or more nonvolatile memory elements, such as EPROM, EEPROM, Flash memory, a hard drive, etc.) that may store an analog signal software (SW) module 832. The analog signal SW module 832 may include instructions that, when executed by the processor 820, cause the programmable device 800 to perform the corresponding functions. The non-transitory computer-readable medium of the memory 830 thus includes instructions for performing all or some of the operations of FIGS. 9-11.

The processor 820 may execute the analog signal SW module 832 to generate the analog signal 818 through the analog signal controller 810. In some implementations, execution of the analog signal SW module 832 may generate, adjust, monitor, and/or change the analog signal 818. For example, the analog signal controller 810 may generate a first analog signal 818 (e.g., a first signal with a first voltage, current, frequency, or duty cycle) for a first time period and then may generate a second analog signal 818 (e.g., a second signal with a second voltage, current, frequency, or duty cycle) for a second time period. Further, execution of the analog signal SW module 832 may enable the analog signal controller 810 to share the analog signal 818 with a plurality of satellite monitors 815 through the bus 817. For example, the analog signal controller 810 may use a token-based procedure, a peer-to-peer communication protocol, and/or a timing signal-based procedure to share the analog signal 818 using the bus 817.

Figure 9:
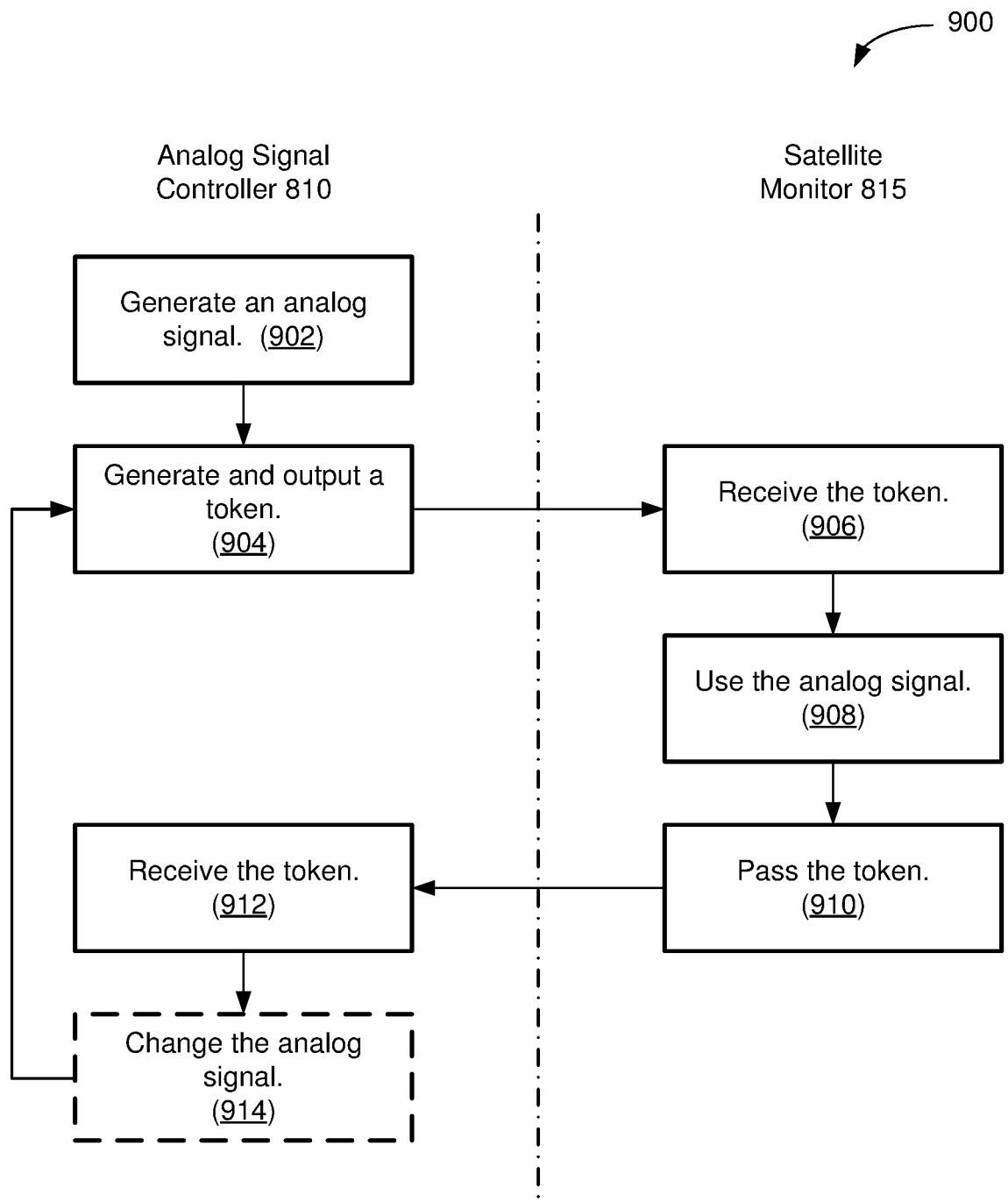
FIG. 9 is an illustrative flow chart depicting an example operation for controlling the use of a shared (multiplexed) analog signal using a token, in accordance with some implementations.

FIG. 9 is an illustrative flow chart depicting an example operation 900 for controlling the use of a shared (multiplexed) analog signal using a token, in accordance with some implementations. The example operation 900 is described below with respect to the analog signal controller 810 and the satellite monitors 815 of FIG. 8 for illustrative purposes only. It is to be understood that the example operation 900 may be performed by any feasible devices, modules, or components included with the programmable device 100 of FIG. 1, the programmable device 800 of FIG. 8, or any other feasible device.

The operation 900 begins at block 902 as the analog signal controller 810 generates an analog signal 818. In some implementations, the analog signal 818 may be coupled to, and distributed by, an analog channel, such as the analog channel 220 of FIG. 2. Next, at block 904, the analog signal controller 810 generates and outputs a token through the bus 817. The token may be any feasible arrangement of bits, bytes, or words that may be associated with the analog signal 818. In some implementations, outputting the token may include passing the token to the satellite monitor 815. Next, at block 906, the satellite monitor 815 receives the token from the analog signal controller 810 through the bus 817. In some implementations, the token may describe a voltage, current, frequency and/or duty cycle of the analog signal 818. Next, at block 908, the satellite monitor 815 uses the analog signal 818. In some implementations, the satellite monitor 815 may only use the analog signal 818 during possession of the token.

Next, at block 910, the satellite monitor 815 passes the token. In some implementations, the satellite monitor 815 passes the token after completing the use of the analog signal 818. In some aspects, at block 910 the satellite monitor 815 may pass the token to other satellite monitors (not shown for simplicity) or to analog signal controller 810. If another satellite monitor receives the token, then the other satellite monitors may use the analog signal 818 (in a manner similar to blocks 906, 908, and 910 described above). In this manner, the analog signal 818 is shared between several satellite monitors.

At block 912, the analog signal controller 810 receives the token. In some implementations, upon reception of the token, the operation 900 ends. In some other implementations, the operation proceeds to block 914 where the analog signal controller 810 may optionally change the value of the analog signal 818 and the operation returns to block 904. In some cases, a different token may be generated to indicate a different value of the analog signal 818.

Figure 10:
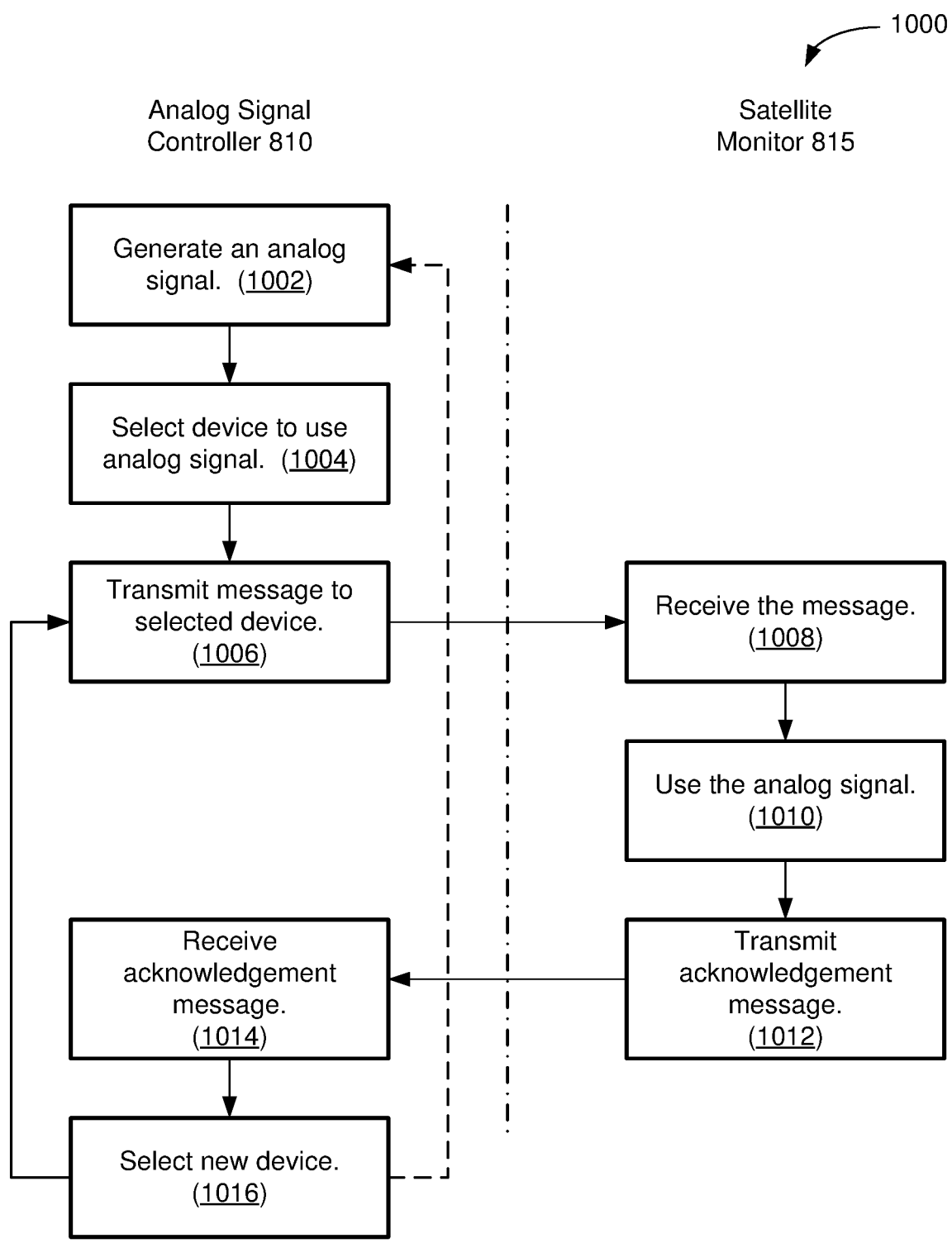
FIG. 10 is an illustrative flow chart depicting an example operation for controlling the use of a shared (multiplexed) analog signal using peer-to-peer communications, in accordance with some implementations.

FIG. 10 is an illustrative flow chart depicting an example operation 1000 for controlling the use of a shared (multiplexed) analog signal using peer-to-peer communications, in accordance with some implementations. The example operation 1000 is described below with respect to the analog signal controller 810 and the satellite monitors 815 of FIG. 8 for illustrative purposes only. It is to be understood that the example operation 1000 may be performed by any feasible devices, modules, or components included with the programmable device 100 of FIG. 1, the programmable device 800 of FIG. 8, or any other feasible device.

The operation 1000 begins at block 1002 as the analog signal controller 810 generates an analog signal 818. In some implementations, the analog signal 818 may be coupled to, and distributed by, an analog channel, such as the analog channel 220 of FIG. 2. Next, at block 1004, the analog signal controller 810 may select any feasible device (e.g., any satellite monitor 815) to use the analog signal 818. Next, at block 1006, the analog signal controller 810 transmits a peer-to-peer message to the selected satellite monitor 815 through the bus 817. Next, at block 1008, the satellite monitor 815 receives the peer-to-peer message from the analog signal controller 810. In some implementations, the received peer-to-peer message may indicate that the satellite monitor 815 is allowed to use the analog signal 818. Next, at block 1010 the satellite monitor 815 uses the analog signal 818.

Next, at block 1012, the satellite monitor 815 transmits an acknowledgement message to the analog signal controller 810. In some implementations, the acknowledgement message may be transmitted through the bus 817. At block 1014, the analog signal controller 810 receives the acknowledgement message. In some aspects, the acknowledgement message may inform the analog signal controller 810 that the satellite monitor 815 has finished using the analog signal 818. Thus, the analog signal controller 810 may select another device (e.g., another satellite monitor) to use the analog signal 818. Next, at block 1016 the analog signal controller 810 selects a new device to use the analog signal 818 and the operation returns to block 1006 where a new peer-to-peer message is transmitted to another satellite monitor 815. In some implementations, after sharing the analog signal 818 with one or more devices, the analog signal controller 810 may generate a different analog signal. In this case, the operation returns to block 1002 (shown by the dashed arrow).

Figure 11:
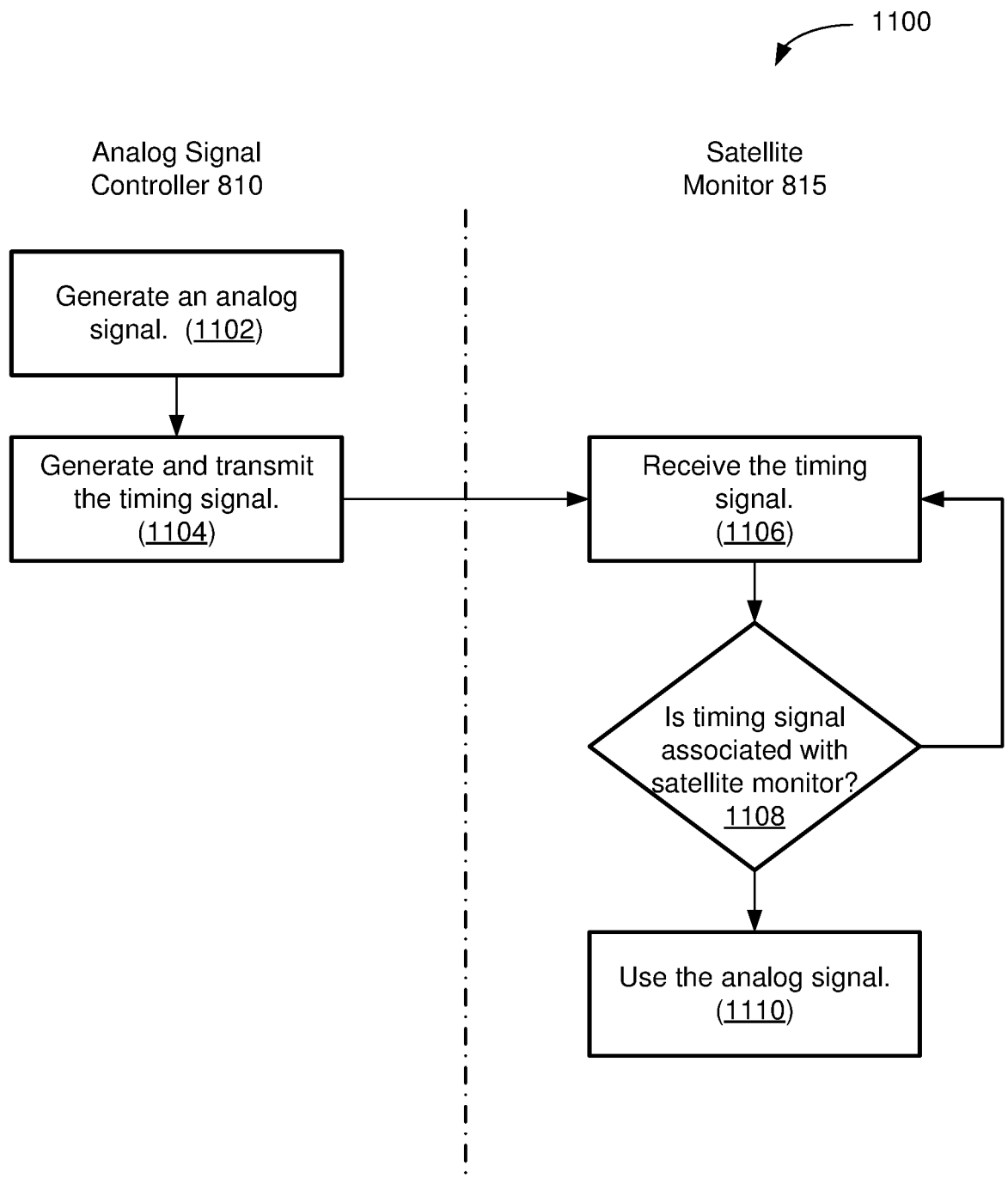
FIG. 11 is an illustrative flow chart depicting an example operation for controlling the use of a shared (multiplexed) analog signal using a timing signal, in accordance with some implementations.

FIG. 11 is an illustrative flow chart depicting an example operation 1100 for controlling the use of a shared (multiplexed) analog signal using a timing signal, in accordance with some implementations. The example operation 1100 is described below with respect to the analog signal controller 810 and the satellite monitors 815 of FIG. 8 for illustrative purposes only. It is to be understood that the example operation 1100 may be performed by any feasible devices, modules, or components included with the programmable device 100 of FIG. 1, the programmable device 800 of FIG. 8, or any other feasible device.

At block 1102, the analog signal controller 810 generates an analog signal. In some implementations, the analog signal controller 810 may be coupled to, and distributed by, an analog channel, such as the analog channel 220 of FIG. 2. At block 1104, the analog signal controller 810 may generate and distribute a timing signal. In some implementations, the timing signal may be an implementation of the timing signal 710 of FIG. 7 and may be distributed through the bus 817.

In block 1106, the satellite monitor 815 receives the timing signal. In block 1108, the satellite monitor 815 determines whether the timing signal includes timing information that may be associated with the satellite monitor 815. In some implementations, the satellite monitor 815 may determine whether the timing signal matches a time period, time slot, time stamp, or the like associated with the satellite monitor 815. If the time signal is not associated with the satellite monitor 815, then the satellite monitor 815 continues to receive the timing signal by returning to block 1106. If the timing signal is associated with the satellite monitor 815, then in block 1110 the satellite monitor 815 uses the analog signal.

Although described above with respect to a single satellite monitor 815, the timing signal and the analog signal may be distributed to a plurality of satellite monitors. Each satellite monitor may be assigned to a different time period, time slot, time stamp, or the like, such that only one satellite monitor uses the analog signal at any one time.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example implementations have been described with reference to specific example implementations thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An analog signal distribution system, comprising:
   an analog signal controller configured to:
   generate an analog reference signal; and
   transmit a token that enables access to the analog reference signal by one or more devices, wherein possession of the token enables access to the analog reference signal, and lack of possession of the token forbids access to the analog reference signal; and
   a first device configured to:
   receive the token;
   use the analog reference signal as a reference signal in response to reception of the token; and
   transmit the token to a second device.

2. The analog signal distribution system of claim 1, wherein the token describes one of a voltage, current, frequency, or duty cycle of the analog reference signal.

3. The analog signal distribution system of claim 1, wherein the analog signal controller is further configured to transmit a peer-to-peer message that instructs the first device to use the analog reference signal.

4. The analog signal distribution system of claim 1, wherein the analog signal controller is further configured to transmit a timing signal that determines when the first device uses the analog reference signal.

5. The analog signal distribution system of claim 1, further comprising:
an analog channel configured to distribute the analog reference signal to a plurality of devices.

6. The analog signal distribution system of claim 1, wherein the analog reference signal is at least one of a reference voltage or a reference current.

7. An apparatus, comprising:
a plurality hardware blocks including logic cells and memory cells;
an analog signal controller configured to:
generate an analog reference signal; and
transmit a token that enables access to the analog reference signal to one or more devices, including at least a first device and a second device, wherein possession of the token enables access to the analog reference signal, and lack of possession of the token forbids access to the analog reference signal;
wherein the first device is configured to:
receive the token;
use the analog reference signal as a reference signal in response of reception of the token; and
transmit the token to the second device.

8. The apparatus of claim 7, wherein the token describes one of a voltage, current, frequency, or duty cycle of the analog reference signal.

9. The apparatus of claim 7, wherein the analog signal controller is further configured to transmit a peer-to-peer message that instructs the first device to use the analog reference signal.

10. The apparatus of claim 7, wherein the analog signal controller is further configured to transmit a timing signal that determines when the first device uses the analog reference signal.

11. The apparatus of claim 7, wherein the analog reference signal is at least one of a reference voltage or a reference current.

12. The apparatus of claim 7, further comprising:
an analog channel configured to distribute the analog reference signal to a plurality of devices.

13. A method for controlling use of an analog reference signal, the method performed by a first device and comprising:
receiving a token through a control bus, wherein possession of the token enables access to the analog reference signal by one or more devices including the first device, and lack of possession of the token forbids access to the analog reference signal;
using the analog reference signal as a reference signal in response to receiving the token; and
transmitting the token through the control bus to a second device.

14. The method of claim 13, wherein the token is transmitted after use of the analog reference signal is complete.

15. The method of claim 13, wherein the token is transmitted after a hold time for the analog reference signal has passed.

16. The method of claim 13, further comprising, waiting a settling time after receiving the token before using the analog reference signal.

17. The analog signal distribution of claim 1, wherein the reception of the token is limited to one device at a time.

18. The analog signal distribution of claim 1, wherein the token is transmitted and received through a loop that couples the analog signal controller to the first and second devices.

19. The analog signal distribution of claim 1, wherein first device is further configured to determine a time duration of the use of the analog reference signal.

20. The analog signal distribution of claim 1, wherein the first device is further configured to wait a time period after reception of the token before use of the analog reference signal.

\* \* \* \* \*